(12) United States Patent
Yu et al.

(10) Patent No.: US 11,901,415 B2
(45) Date of Patent: Feb. 13, 2024

(54) TRANSISTOR ISOLATION STRUCTURES

(71) Applicant: TAIWAN SEMICONDUCTOR MANUFACTURING CO., LTD., Hsinchu (TW)

(72) Inventors: Chia-Ta Yu, New Taipei (TW); Yen-Chieh Huang, Tainan (TW); Yi-Hsien Tu, Hsinchu (TW); I-Hsieh Wong, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 199 days.

(21) Appl. No.: 17/333,276

(22) Filed: May 28, 2021

(65) Prior Publication Data

US 2022/0384576 A1 Dec. 1, 2022

(51) Int. Cl.
*H01L 29/10* (2006.01)
*H01L 29/66* (2006.01)
(Continued)

(52) U.S. Cl.
CPC .... *H01L 29/1083* (2013.01); *H01L 21/02378* (2013.01); *H01L 21/761* (2013.01);
(Continued)

(58) Field of Classification Search
CPC ......... H01L 21/02378; H01L 21/02532; H01L 21/02576; H01L 21/02579; H01L 21/0262; H01L 21/761; H01L 21/823431; H01L 21/823821; H01L 27/0886; H01L 27/092; H01L 29/0665; H01L 29/1083; H01L 29/42392; H01L 29/78696; H01L 21/823878; H01L 27/088; H01L 27/0924; H01L 29/0673; H01L 29/66439; H01L 29/775; H01L 29/7848; B82Y 10/00
See application file for complete search history.

(56) References Cited

U.S. PATENT DOCUMENTS 9,093,530 B2 7/2015 Huang et al.
9,171,929 B2 10/2015 Lee et al.
(Continued)

*Primary Examiner* — Cheung Lee
(74) *Attorney, Agent, or Firm* — Sterne, Kessler, Goldstein & Fox P.L.L.C.

(57) ABSTRACT

The present disclosure is directed to methods for the fabrication of buried layers in gate-all-around (GAA) transistor structures to suppress junction leakage. In some embodiments, the method includes forming a doped epitaxial layer on a substrate, forming a stack of alternating first and second nano-sheet layers on the epitaxial layer, and patterning the stack and the epitaxial layer to form a fin structure. The method includes forming a sacrificial gate structure on the fin structure, removing portions of the fin structure not covered by the sacrificial gate structure, and etching portions of the first nano-sheet layers. Additionally, the method includes forming spacer structures on the etched portions of the first nano-sheet layers and forming source/drain (S/D) epitaxial structures on the epitaxial layer abutting the second nano-sheet layers. The method further includes removing the sacrificial gate structure, removing the first nano-sheet layers, and forming a gate structure around the second nano-sheet layers.

20 Claims, 14 Drawing Sheets

(51) Int. Cl.
*H01L 29/167* (2006.01)
*H01L 21/761* (2006.01)
*H01L 27/092* (2006.01)
*H01L 21/8234* (2006.01)
*H01L 21/8238* (2006.01)
*H01L 27/088* (2006.01)
*H01L 21/02* (2006.01)
*H01L 29/423* (2006.01)
*H01L 29/06* (2006.01)
*H01L 29/786* (2006.01)

(52) U.S. Cl.
CPC ........ *H01L 21/823431* (2013.01); *H01L 21/823821* (2013.01); *H01L 27/0886* (2013.01); *H01L 27/092* (2013.01); *H01L 29/167* (2013.01); *H01L 29/6653* (2013.01); *H01L 29/66545* (2013.01); *H01L 29/66553* (2013.01); *H01L 21/0262* (2013.01); *H01L 21/02532* (2013.01); *H01L 21/02576* (2013.01); *H01L 21/02579* (2013.01); *H01L 29/0665* (2013.01); *H01L 29/42392* (2013.01); *H01L 29/78696* (2013.01)

(56) References Cited

U.S. PATENT DOCUMENTS

| | | | |
|---|---|---|---|
| 9,214,555 | B2 | 12/2015 | Oxland et al. |
| 9,236,267 | B2 | 1/2016 | De et al. |
| 9,520,482 | B1 | 12/2016 | Chang et al. |
| 9,548,303 | B2 | 1/2017 | Lee et al. |
| 9,564,489 | B2 | 2/2017 | Yeo et al. |
| 9,576,814 | B2 | 2/2017 | Wu et al. |
| 9,601,342 | B2 | 3/2017 | Lee et al. |
| 9,608,116 | B2 | 3/2017 | Ching et al. |
| 10,453,824 | B1* | 10/2019 | Mochizuki ........ H01L 21/32139 |
| 2015/0295085 | A1* | 10/2015 | Yu ..................... H01L 29/1083 438/197 |

* cited by examiner

300

A

Remove portions of the fin structures not covered by the sacrificial gate structures — 325

Selectively etch edge portions of the first nano-sheet layers from the fin structures — 330

Form a spacer structure on the etched portions of each first nano-sheet layer — 335

Form source/drain epitaxial structures on the buried layer — 340

FIG. 3B

TRANSISTOR ISOLATION STRUCTURES

BACKGROUND

Source/drain regions in fin-based field effect transistors (finFETs) are grown from side surfaces of the fin structures and a top surface of the semiconductor substrate on which the fin structures are formed. During operation, a leakage current path can be formed between the source/drain regions and the semiconductor substrate. The leakage current can degrade the finFET's performance.

BRIEF DESCRIPTION OF THE DRAWINGS

Aspects of the present disclosure are best understood from the following detailed description when read with the accompanying figures.

FIGS. 3A and 3B are flow charts of a method for the fabrication of gate-all-around nano-sheet FETs on a buried layer disposed on a substrate, in accordance with some embodiments.

DETAILED DESCRIPTION

Figure 1:
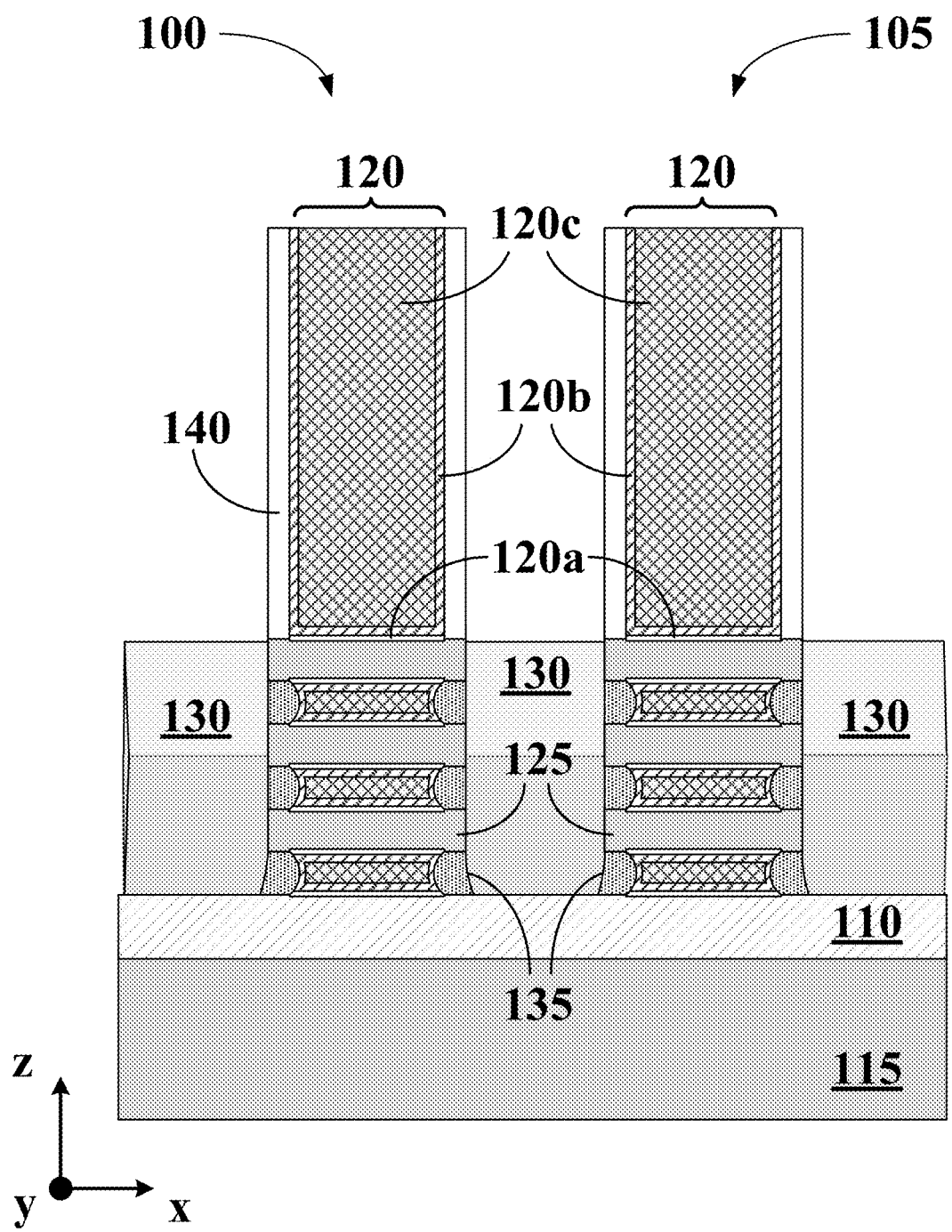
FIG. 1 is a cross-sectional view of gate-all-around nano-sheet FETs formed on a buried layer disposed on a substrate, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed that are between the first and second features, such that the first and second features are not in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, the terms "about" and "substantially" can indicate a value of a given quantity that varies within 5% of the value (e.g., ±1%, ±2%, ±3%, ±4%, ±5% of the value). These values are merely examples and are not intended to be limiting. It is to be understood that the terms "about" and "substantially" can refer to a percentage of the values as interpreted by those skilled in relevant art(s) in light of the teachings herein.

Gate-all-around (GAA) field effect transistors (GAA-FETs), such as nano-sheet or nano-wire GAA-FETs, have improved gate control over their channel regions compared to other types of FETs whose gate structure covers sidewall portions and top surfaces of semiconductor fin structures. Due to their gate-all-around geometry, GAA nano-sheet or nano-wire FETs achieve larger effective channel widths and higher drive currents. At the same time, their distinct geometry makes GAA nano-sheet or nano-wire FETs susceptible to leakage current. For example, the gate electrode, which surrounds the nano-sheets of the FET, is formed in close proximity to the semiconductor substrate. As a result, and during operation, a parasitic channel can be formed within the semiconductor substrate between the source/drain terminals. This parasitic channel can degrade the performance of the GAA FET and increase the transistor's power consumption. To suppress the parasitic channel formation, the semiconductor substrate can be "counter-doped" with implants—e.g., the semiconductor substrate is doped with a dopant type opposite to the dopant type in the channel region of the nano-sheet or nano-wires. However, doping the semiconductor substrate with an implant process adds cost to the manufacturing process and/or may not effectively eliminate or suppress the parasitic channel formation.

In addition to the above, etching processes used during the GAA-FET fabrication process can have undesirable "side effects," which exacerbate the appearance of leakage current. For example, etching processes used in the formation of the channel region and the spacer structures between the gate structure and the S/D terminals of a GAA-FET can result in the formation of over-etched areas within the substrate below the S/D terminals. These over-etched areas can be susceptible to junction leakage current between the S/D terminals and the substrate.

The embodiments described herein are directed to methods for the fabrication of buried layers in GAA FETs, which prevent the formation of over-etched areas in the substrate by subsequent etching processes. In some embodiments, the buried layer is formed between the GAA FETs and the substrate at a thickness between about 5 nm and about 20 nm. According to some embodiments, the buried layers can be formed for p-type and n-type GAA-FETs and can include doped or un-doped (e.g., intrinsic) silicon layers. In some embodiments, the buried layers include a wide bandgap material, such as carbon-doped silicon. In some embodiments, the dopant selection for the silicon layers is based on the type of GAA-FETs—e.g., n-type or p-type. In some embodiments, the dopant concentration is larger than about $1 \times 10^{21}$ atoms/cm$^3$.

According to some embodiments, FIG. 1 is a cross-sectional view of two GAA-FETs, 100 and 105, formed on a buried layer 110, which in turn is disposed on substrate 115. Each of GAA-FETs 100 and 105 includes a gate structure 120, which surrounds semiconductor nano-sheet (NS) or nano-wire (NW) layers 125. By way of example and not limitation, each gate structure 120 includes a dielectric stack formed by an interfacial dielectric layer 120a and a high-k dielectric 120b. Further, each gate structure 120 includes a gate electrode 120c with capping layers, one or more work function metallic layers, and a metal fill layer not shown in FIG. 1 for simplicity.

Further, GAA-FETs 100 and 105 include source/drain (S/D) epitaxial structures 130 in contact with NS or NW layers 125. Each S/D epitaxial structure 130 includes one or more doped epitaxial layers, which are successively formed on buried layer 110. In some embodiments, S/D epitaxial structures 130 are electrically isolated from gate structures 120 via spacer structures 135. Spacer structures 135 further separate NS or NW layers 125 in the vertical direction (e.g., along the z-direction) as shown in FIG. 1.

In some embodiments, sidewall surfaces of gate structures 120 in GAA-FETs 100 and 105 are covered by gate spacers 140, which provide structural support during the formation of gate structures 120. In addition, gate spacers 140 provide to gate structures 120 electrical isolation and protection during the formation of S/D contacts, which are not shown in FIG. 1.

In some embodiments, GAA-FETs 100 and 105 can be either n-type or p-type (e.g., pFETs or nFETs). Additional GAA-FETs, similar to the GAA-FETs shown in FIG. 1, can be formed over substrate 115. These additional GAA-FETs are within the spirit and the scope of this disclosure. In some embodiments, p-type GAA FETs have S/D epitaxial structures 130 with boron-doped (B-doped) silicon-germanium (SiGe) layers, B-doped germanium (Ge) layers, B-doped germanium-tin (GeSn) layers, or combinations thereof. In some embodiments, n-type GAA FETs have S/D epitaxial structures 130 with arsenic (As)-doped silicon layers (Si—As), phosphorous (P)-doped silicon layers (Si—P), carbon-containing silicon layers (Si—C), or combinations thereof. In some embodiments, S/D epitaxial structures 130 are grown directly on top surfaces of buried layer 110.

In some embodiments, buried layer 110 has a thickness between about 5 nm and about 20 nm, and includes a doped silicon layer that forms a p-n junction depletion region between GAA-FETs 100/105 and substrate 115 to suppress any junction leakage current between GAA-FETs 100/105 to substrate 115. In some embodiments, dopants in buried layer 110 are introduced during the growth process as opposed to being introduced with an ion implantation process after growth. Introduction of dopants during growth offers benefits over ion implantation. For example, the dopant concentration achieved during growth can be higher than that achieved by ion implantation. In some embodiments, the dopant concentration achieved during the growth can be greater than about $1 \times 10^{21}$ atoms/cm$^3$. Further, the dopants can be uniformly distributed across the thickness of buried layer 110 as opposed to being normally distributed within buried layer 110. This means that dopants introduced during growth can have a uniform dopant profile across the thickness of buried layer 110 compared to implanted dopants. In some embodiments, an activation anneal is performed after growth.

In some embodiments, buried layer 110 can be doped with As, P, or combinations thereof when GAA FETs 100 and 105 are p-type transistors and with B when GAA FETs 100 and 105 are n-type transistors. This combination of dopants ensures that a p-n junction depletion region is formed between GAA-FETs 100/105 and substrate 115 to suppress the flow of leakage current from GAA-FETs 100/105 to substrate 115.

In some embodiments, buried layer 110 can be a silicon layer containing C at a concentration of less than about 5 atomic percent (at. %) to form a Si—C wide bandgap barrier between GAA-FETs 100/105 and substrate 115. In some embodiments, the Si—C bandgap is between about 3 eV and 3.4 eV, which is wider than the intrinsic silicon bandgap of about 1.12 eV. In some embodiments, Si—C buried layers 110 are applicable to both n-type and p-type GAA-FETs. This is because Si—C forms an insulating barrier between GAA-FETs 100/105 and substrate 115 as opposed to a p-n junction depletion region, whose dopants selection is based on the type of the transistors (n-type or p-type) formed thereon.

In some embodiments, buried layer 110 acts as an etch mask that protects substrate 115 from being etched by an etching process used in the formation of the channel region and spacer structures 135. If buried layer 110 is not present and the aforementioned etching process etches substrate 115, S/D epitaxial structures 130 will be formed within the etched areas of substrate 115. Therefore, during operation of GAA FETs 100 and 105, a leakage current path can be formed between GAA-FETs 100/105 and substrate 105. By way of example and not limitation, and in referring to FIG. 2, arrows 200 represent the leakage current path between GAA-FETs 100/105 and substrate 105 when buried layer 110 is not present and an etching process etches exposed portions of substrate 115. In this case, substrate 115 can be counter-doped with an ion implant process to limit the amount of leakage current. However, ion implant processes add complexity to the fabrication process and increase the fabrication cost.

Figure 3A:
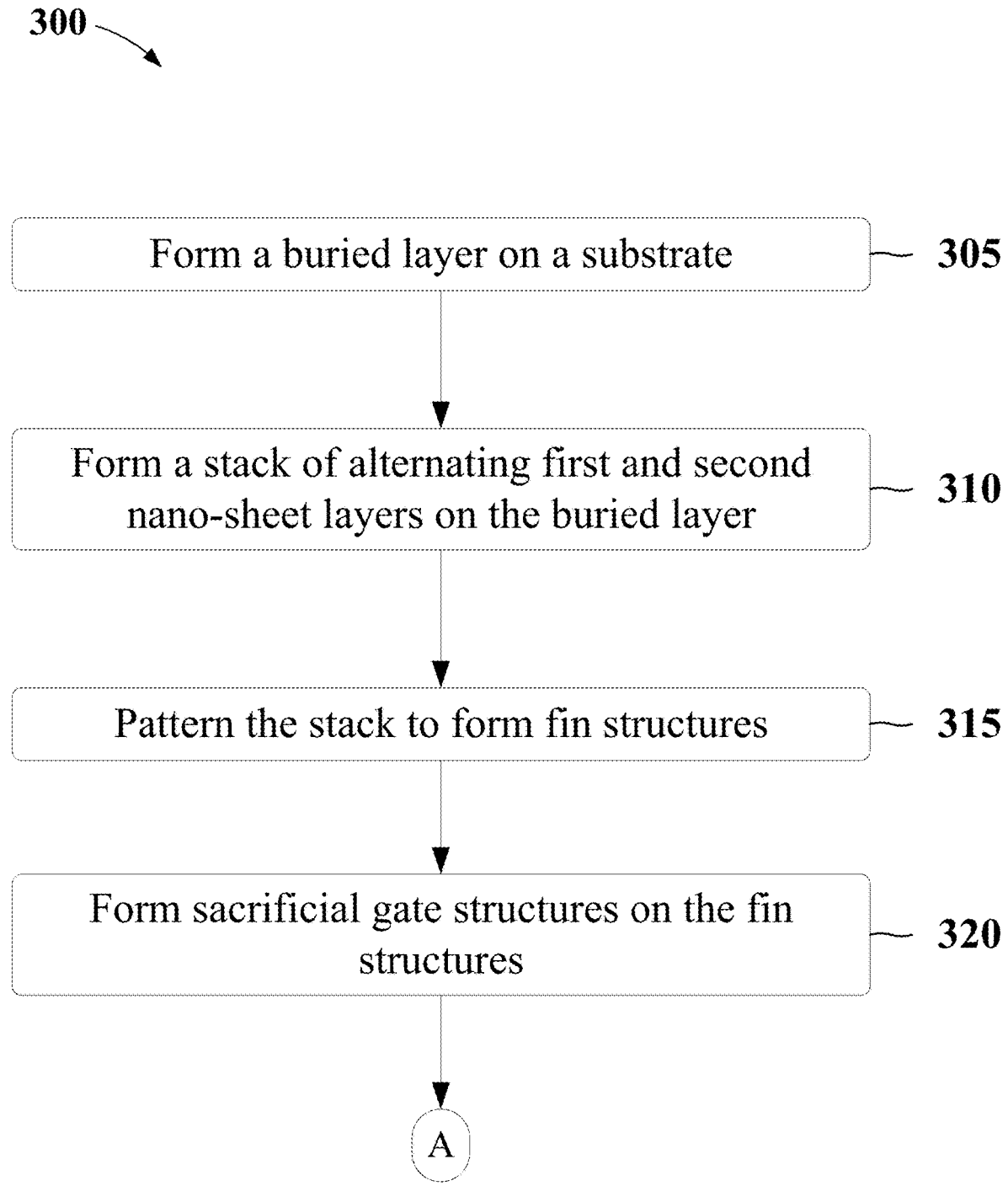

According to some embodiments, FIGS. 3A and 3B are flow charts of a fabrication method 300 for the formation of buried layer 110 below GAA-FETs 100 and 105 shown in FIG. 1. Other fabrication operations can be performed between the various operations of method 300 and are omitted merely for clarity. This disclosure is not limited to this operational description. Rather, other operations are within the spirit and scope of the present disclosure. It is to be appreciated that additional operations may be performed. Moreover, not all operations may be needed to perform the disclosure provided herein. Additionally, some of the operations may be performed simultaneously, or in a different order than the ones shown in FIGS. 3A and 3B. In some embodiments, one or more other operations may be performed in addition to or in place of the presently described operations. For illustrative purposes, method 300 is described with reference to the embodiments shown in FIGS. 4 through 12.

In referring to FIG. 3A, method 300 begins with operation 305 and the process of forming a buried layer (e.g., buried layer 110) on a substrate (e.g., substrate 115). In some embodiments, the substrate (e.g., substrate 115) includes silicon or another elementary semiconductor, such as germanium (Ge). In some embodiments, the substrate includes a compound semiconductor like silicon carbide (SiC), gallium arsenide (GaAs), gallium phosphide (GaP), indium phosphide (InP), indium arsenide (InAs), or indium antimonide (InSb). In some embodiments, the substrate includes an alloy semiconductor like silicon germanium (SiGe), gallium arsenide phosphide (GaAsP), aluminum indium arsenide (AlInAs), aluminum gallium arsenide (AlGaAs), gallium indium arsenide (GaInAs), gallium indium phosphide (GaInP), or gallium indium arsenide phosphide (GaInAsP). In some embodiments, the substrate includes any combination of the aforementioned materials. In some embodiments, substrate 115 is lightly doped (e.g., P-doped) with a dopant concentration between about $1 \times 10^{14}$ atoms/cm$^3$ and about $1 \times 10^{15}$ atoms/cm$^3$.

In some embodiments, the buried layer is grown on top surfaces of the substrate. The buried layer can be epitaxially grown directly on the substrate with a chemical vapor deposition (CVD) process with silicon precursors, such as silane (SiH$_4$), disilane (Si$_2$H$_6$), dichlorosilane (SiH$_2$Cl$_2$), other suitable gases, or combinations thereof. During growth, dopants (e.g., B, P, As) are introduced in the buried layer with appropriate precursor gases, such as diborane (B$_2$H$_6$), phosphine (PH$_3$), arsine (AsH$_3$), other suitable gases, or combinations thereof. In some embodiments, the dopant concentration in the buried layer is set to be higher than about $1 \times 10^{21}$ atoms/cm$^3$ to ensure that a p-n junction with a sufficient depletion width is formed between the GAA FET and the buried layer to prevent junction leakage current. As discussed above, incorporation of dopants during the epitaxial growth ensures a uniform distribution of dopants across the thickness of the buried layer and a high dopant concentration (e.g., compared to ion implantation). In some embodiments, carbon is incorporated to buried layer 110 with the addition of organic gases, such monomethylsilane (MMS). The incorporated amount of carbon in buried layer 110 is less than about 5 at. % according to some embodiments. Carbon increases the bandgap of buried layer and reduces its current conduction ability. In some embodiments, carbon concentrations higher than about 5 at. % introduce mechanical stress to the transistors, which is undesirable because it impacts the transistor's electrical characteristics and induces unwanted variability between transistors. Additionally, carbon concentrations higher than about 5 at. % require higher thermal budgets, which increase the manufacturing cost and can be challenging to integrate into the manufacturing flow.

In some embodiments, the buried layer can be deposited at a temperature between about 550° C. and 800° C. and at a process pressure between about 1 Torr and about 600 Torr.

In some embodiments, the buried layer is deposited at a thickness between about 5 nm and about 20 nm. In some embodiments, thicknesses below about 5 nm do not provide sufficient protection against subsequent etching operations. On the other hand, thicknesses greater than 20 nm can induce mechanical stress to the GAA FETs formed thereon, which can alter the electrical characteristics of the GAA-FET. In some embodiments, the as-deposited thickness of buried layer can be adjusted based on the etching rate of buried layer by the etching process used in subsequent operations. For example, an etching process with a high etching rate requires a thicker as-deposited buried layer compared to an etching process with a lower etching rate. The additional thickness compensates for any material loss experienced by the buried layer during the etching process so that the thickness of the burlier layer after the etching is no less than about 5 nm.

Figure 4:
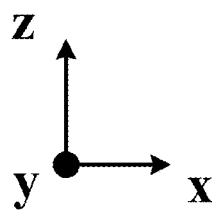
FIGS. 4 and 5 are cross-sectional views of intermediate structures during the fabrication of gate-all-around nano-sheet FETs on a buried layer disposed on a substrate, in accordance with some embodiments.
Figure 4:
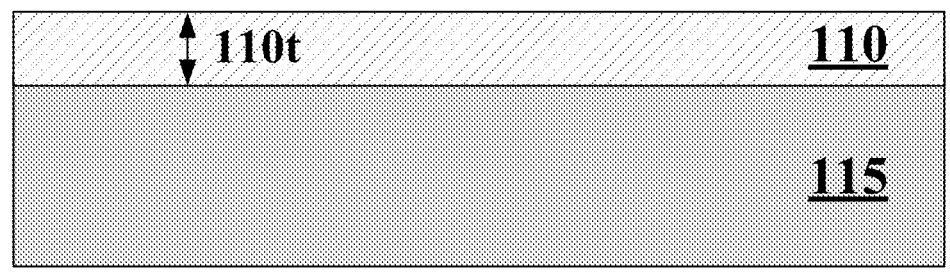

According to some embodiments, FIG. 4 is a cross-sectional view of substrate 115 after the deposition of buried layer 110 at a thickness 110t according to operation 305 of method 300. By way of example and not limitation, buried layer 110 can be deposited to cover the entire top surface of substrate 115. In some embodiments, burrier layer 110 can be patterned to cover selective areas of substrate 115 where GAA-FETs are formed—for example, buried layer 110 is removed from areas of substrate 115 where GAA-FETs are not formed.

Figure 5:
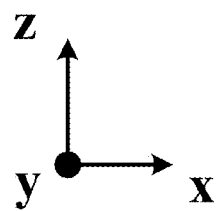
Figure 5:
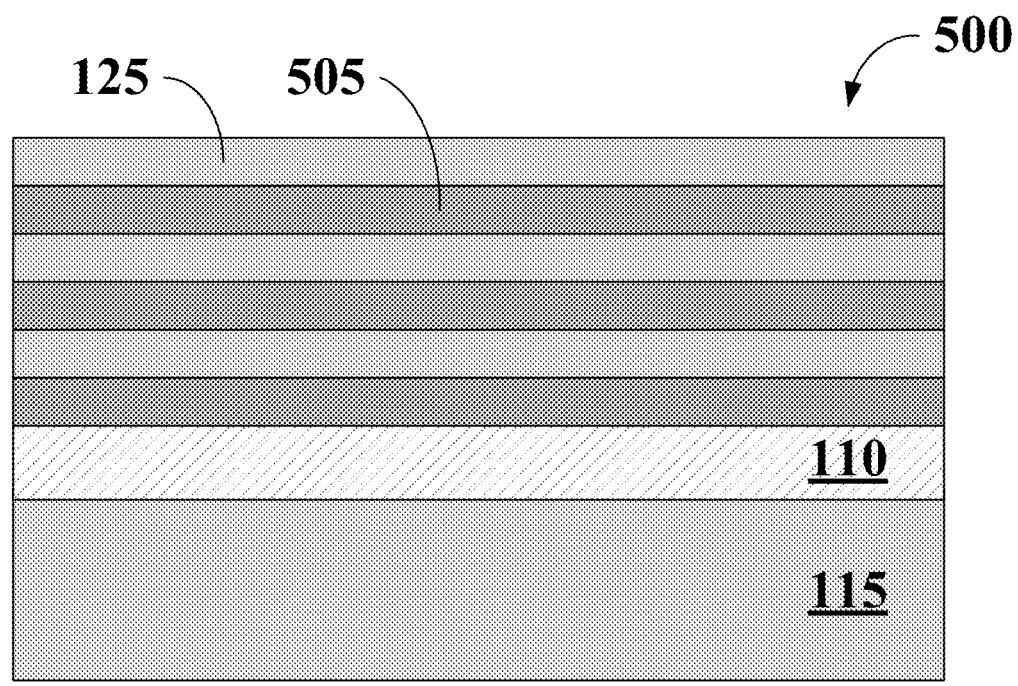

In referring to FIG. 3A, method 300 continues with operation 310 and the process of forming a stack of alternating first and second NS layers on buried layer 110. In some embodiments, the formation of the stack according to operation 310 includes a sequential deposition of NS layer 125, shown in FIG. 1, and another type of NS layer different from NS layer 125. By way of example and not limitation, FIG. 5 shows a stack 500 of alternating NS layer 505 (first NS layer) and NS layer 125 (second NS layer) formed on buried layer 110 according to operation 310. In some embodiments, the material of NS layers 505 (first NS layers) in stack 500 is selected so that NS layers 505 can be selectively removed via etching from stack 500 without removing NS layers 125 (second NS layers). For example, if NS layers 125 are silicon (Si) NS layers, NS layers 505 can be silicon germanium (SiGe) NS layers. In some embodiments, the deposition sequence starts with the type of NS layers to be removed; for example, in this case with NS layer 505 (first NS layer).

In some embodiments, layers 125 and 505 are referred to as "nano-sheets" when their width along the y-direction is substantially different from their height along z-direction (e.g., when the width is larger/narrower than their height). In some embodiments, layers 125 and 505 are referred to as "nano-wires" when their width along the y-direction is equal to their height along z-direction. In some embodiments, layers 125 and 505 are deposited as nano-sheets and subsequently patterned to form nano-wires with equal height and width. By way of example and not limitation, layers 505 and 125 will be described in the context of nano-sheets (NS) layers (e.g., first and second NS layers, respectively). Based on the disclosure herein, nano-wires, as discussed above, are within the spirit and the scope of this disclosure. Further, for example purposes and without limiting the scope of this disclosure, NS layers 125 and 505 in method 300 will be described in the context of Si and SiGe NS layers.

NS layers 125 and 505 can be grown using any suitable method. For example, NS layers 125 and 505 can be grown using a CVD process with precursor gases like SiH$_4$, Si$_2$H$_6$, SiH$_2$Cl$_2$, germane (GeH$_4$), digermane (Ge$_2$H$_6$), other suitable gases, or combinations thereof. In some embodiments, NS layers 505 include between about 20 at. % and about 30 at. % Ge while NS layers 125 are substantially germanium-free—e.g., have a Ge concentration between about 0.1% and about 1%. In some embodiments, NS layers 125, which form the channel region of GAA-FET 100, can be lightly doped or intrinsic (e.g., un-doped). If lightly doped, the doping level of NS layers 125 is less than about $10^{13}$ atoms/cm$^3$. NS layers 505 and 125 can be deposited sequential without a vacuum break (e.g., in-situ) to avoid the formation of any intervening layers. In some embodiments, NS layers 505 can be doped to increase their etching selectivity compared to NS layers 125 in a subsequent etching operation.

In some embodiments, the thickness of NS layers 505 controls the spacing between every other NS layer 125 in stack 500. The thickness of each NS layer 125 and 505 can range, for example, from about 5 nm to about 8 nm. Since the NS layers 125 and 505 are grown individually, the thickness of each NS layer 505 and 125 can be adjusted independently based, for example, on the deposition time.

In referring to FIG. 3A, method 300 continues with operation 315 and the process of patterning stack 500 to form fin structures. In some embodiments, stack 500 is patterned to form fin structures with a width along the y-direction and a length along the x-direction. The fin structures can be formed by patterning with any suitable method. For example, the fin structures may be patterned using one or more photolithography processes, including double-patterning or multi-patterning processes. Double-patterning or multi-patterning processes can combine photolithography and self-aligned processes, allowing patterns to be created that have, for example, pitches smaller than what is otherwise obtainable using a single, direct photolithography process. For example, in some embodiments, a sacrificial layer is formed over stack 500 and patterned using a photolithography process. Spacers are formed alongside the patterned sacrificial layer using a self-aligned process. The sacrificial layer is then removed, and the remaining spacers may then be used as masking structures to pattern the fin structures.

Figure 6:
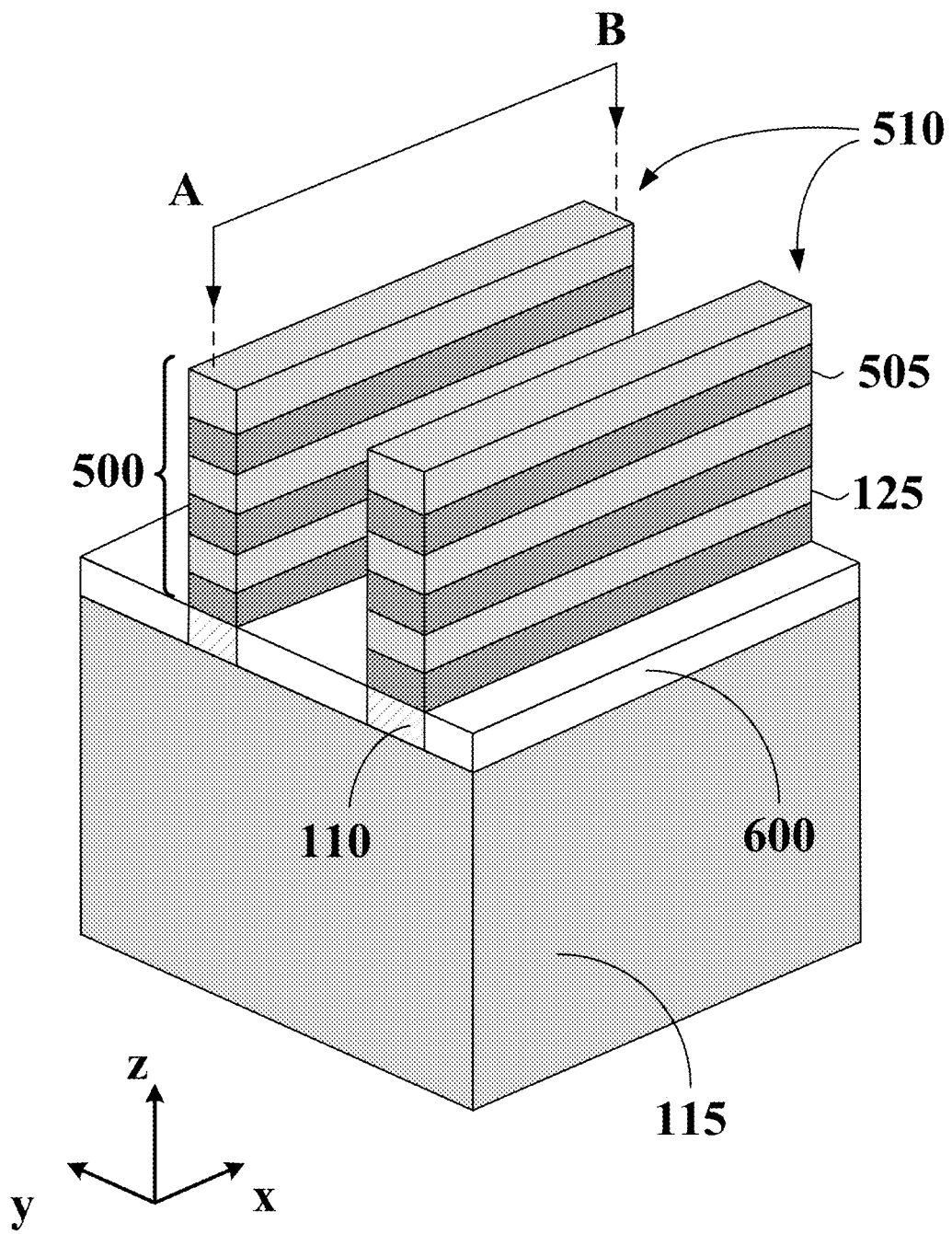
FIG. 6 is an isometric view of an intermediate structure during the fabrication of gate-all-around nano-sheet FETs on a buried layer disposed on a substrate, in accordance with some embodiments.

By way of example and not limitation, FIG. 6 is an isometric view of fin structures 510 formed from stack 500 with the aforementioned patterning process. Additional fin structures, like fin structures 510, can be formed on substrate 115 in the same or different area of substrate 115. These additional fin structures are not shown in FIG. 6 for simplicity. By way of example and not limitation, each fin structure 510 has a width along the y-direction between about 15 nm and about 150 nm.

In some embodiments, after the formation of fin structures 510, an isolation structure 600 is formed on substrate 115 to cover sidewall surfaces of buried layer 110. In some embodiments, isolation structure 600 is a shallow trench isolation (STI) structure that electrically isolates fin structures 510 and includes a silicon oxide based dielectric. By way of example and not limitation, isolation structure 600 can be formed as follows. Isolation structure material (e.g., a silicon oxide based dielectric) is blanket deposited over fin structures 510 and substrate 115. The as-deposited isolation structure material is planarized (e.g., with a chemical mechanical polishing (CMP) process) so that the top surface of the isolation structure material is coplanar with the top surface of fin structures 510. The planarized isolation structure material is etched-back so that the resulting isolation structure 600 has a height substantially similar to buried layer 110, as shown in FIG. 6. In some embodiments, stack 500 protrudes from isolation structure 600 so that isolation structure 600 does not cover any sidewall portion of stack 500 as shown in FIG. 6. This is intentional and facilitates the formation of GAA-FETs 100 and 105 shown in FIG. 1.

Figure 7:
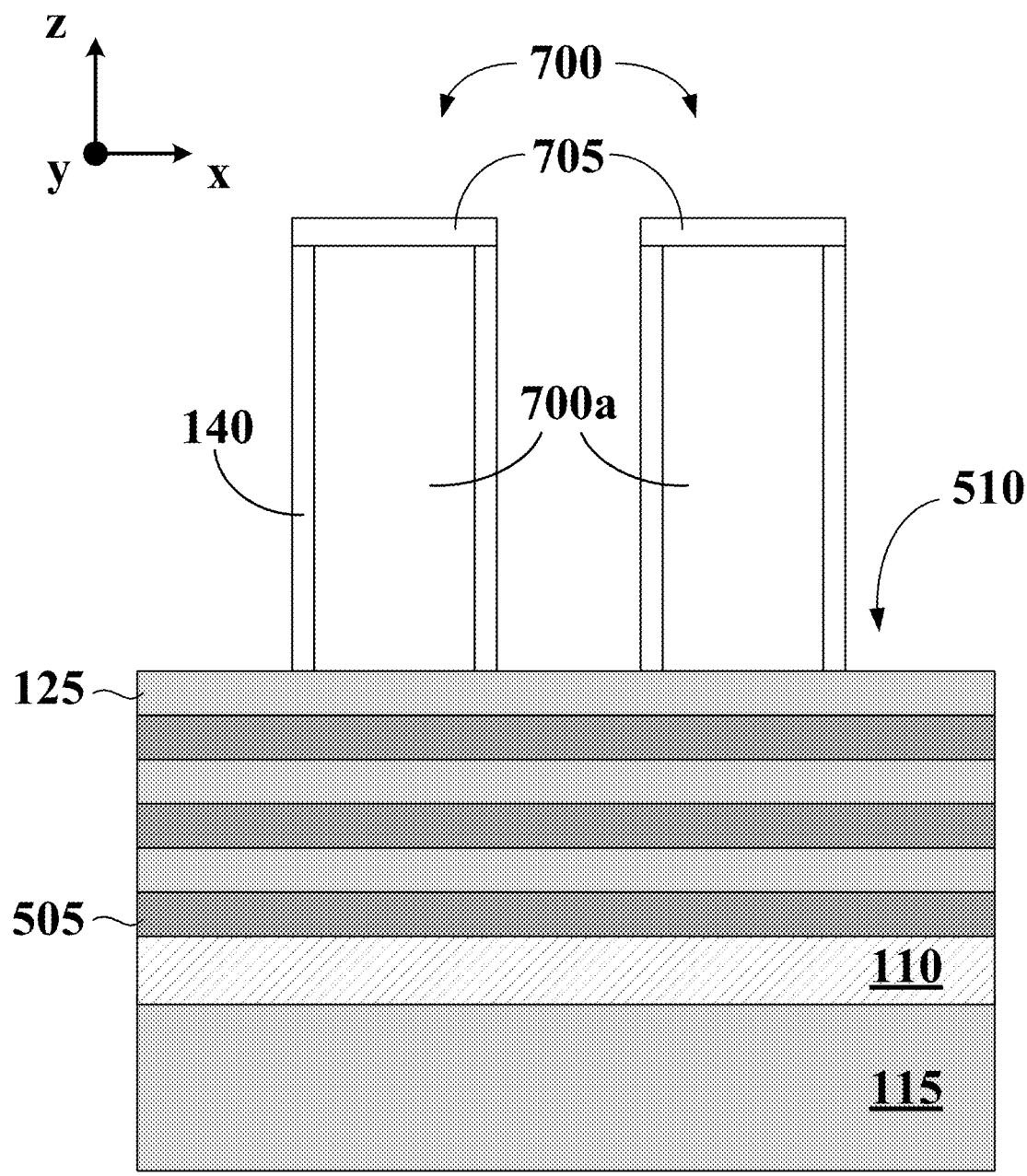
FIGS. 7-12 are cross-sectional views of intermediate structures during the fabrication of gate-all-around nano-sheet FETs on a buried layer disposed on a substrate, in accordance with some embodiments.

In referring to FIG. 3A, method 300 continues with operation 320 and the process of forming sacrificial gate structures on fin structures 510. In some embodiments, the sacrificial gate structures are formed with their length along the y-direction—e.g., perpendicular to fin structures 510 shown in the isometric view of FIG. 6—and their width along the x-direction. By way of example and not limitation, FIG. 7 is a cross-sectional view of FIG. 6 along cut-line AB. FIG. 7 shows sacrificial gate structures 700 formed on portions of fin structures 510. Because FIG. 7 is a cross-sectional view, portions of gate structures 700 covering sidewall portions of fin structures 510 are not shown. Further, in the cross-sectional view of FIG. 7, only one of fin structures 510 from FIG. 6 is shown. In some embodiments, portions of gate structures 700 are formed between fin structures 510 and on isolation structure 600 shown in FIG. 6.

In some embodiments, gate structures 700 cover top and sidewall portions of fin structures 510. In some embodiments, sacrificial gate structures 700 are replaced by gate structures 120 shown in FIG. 1 during a gate replacement process. Gate structures 700 include a sacrificial gate electrode 700a and a sacrificial gate dielectric not shown in FIG. 7 for simplicity. At this fabrication stage, gate spacers 140 and capping layers 705 are formed on sidewall and top surfaces of sacrificial gate structures 700. As discussed above, gate spacers 140 are not removed during the gate replacement process; instead, gate spacers 140 facilitate the formation of gate structures 120. Capping layers 705 protect sacrificial gate electrode 700a from subsequent etching operations discussed below.

By way of example and not limitation, sacrificial gate structures 700 are formed by depositing and patterning the sacrificial gate dielectric and gate electrode layers over fin structures 510. Gate spacers 140 and capping layer 705 are formed once sacrificial gate structures 700 are formed. In some embodiments, sacrificial gate structures 700 are formed over multiple fin structures 510. As shown in FIG. 7, edge portions of fin structures 510 are not covered by sacrificial gate structures 700. This is because, the width of sacrificial gate structures 700 is narrower than the length of fin structures 510 along the x-direction. In some embodiments, sacrificial gate structures 700 are used as masking structures in subsequent etching operations to define the channel region of GAA-FETs 100 and 105 shown in FIG. 1. For this reason, the lateral dimensions (e.g., the width and length) of sacrificial gate structures 700 and gate structures 120 are substantially similar.

Figure 8:
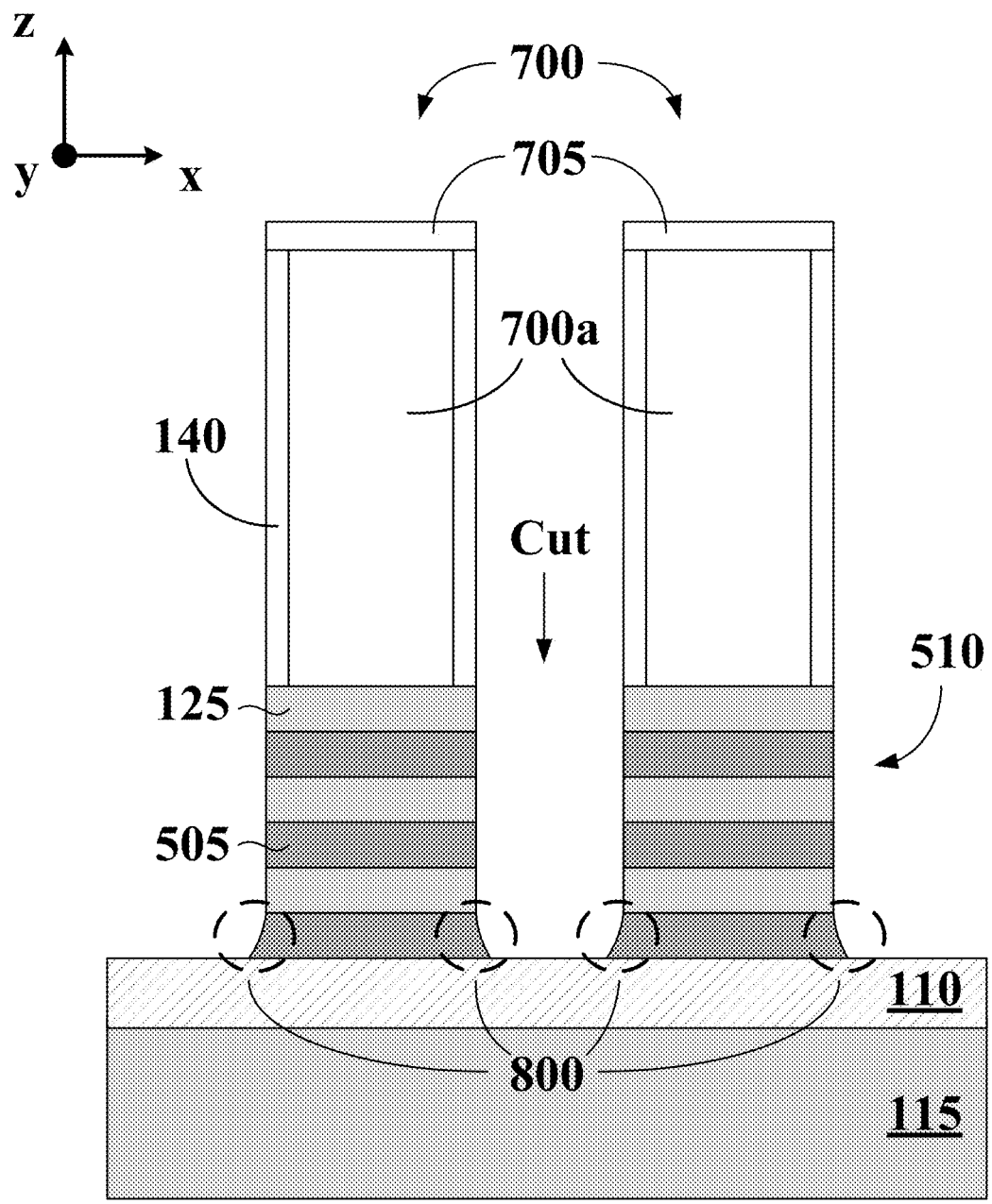

In referring to FIG. 3B, method 300 continues with operation 325 and the process of removing (e.g., "trimming") portions of fin structures 510 not covered by sacrificial gate structures 700. As discussed above, the edge portions of fin structures 510 are not covered by sacrificial gate structures 700 and are therefore removed in operation 325. In some embodiments, FIG. 8 shows the structure of FIG. 7 after operation 325. In some embodiments, the removal process involves a dry etching process, a wet etching process, or a combination thereof. The removal process is selective towards NS layers 125 and NS layers 505 (e.g., Si and SiGe). In some embodiments, the dry etching process can include etchants having an oxygen-containing gas, a fluorine-containing gas (e.g., carbon tetrafluoride ($CF_4$), sulfur hexafluoride ($SF_6$), difluoromethane ($CH_2F_2$), trifluoromethane ($CHF_3$), and/or hexafluoroethane ($C_2F_6$)); a chlorine-containing gas (e.g., chlorine ($Cl_2$), chloroform ($CHCl_3$), carbon tetrachloride ($CCl_4$), and/or boron trichloride ($BCl_3$)); a bromine-containing gas (e.g., hydrogen bromide (HBr) and/or bromoform ($CHBr_3$)); an iodine-containing gas; other suitable etching gases and/or plasmas; or combinations thereof. The wet etching chemistry can include dilute hydrofluoric acid (DHF), potassium hydroxide (KOH) solution, ammonia; a solution containing hydrofluoric acid (HF), nitric acid ($HNO_3$), acetic acid ($CH_3COOH$); or combinations thereof.

In some embodiments, the etchants of the aforementioned etching process do not substantially etch buried layer 110. This is because the dopants in buried layer 110 reduce the etching selectivity of the etchants towards buried layer 110. Further, the etchants do not etch sacrificial gate structures 700—which is protected by capping layers 705 and gate spacers 140—and isolation structure 600 shown in FIG. 6. This is because capping layers 705, gate spacers 140, and isolation structure 600 include materials with a low etching selectivity, such as a silicon nitride based material (e.g., silicon nitride, silicon carbon nitride, silicon carbon oxynitride, etc.) or silicon oxide based materials. In some embodiments, isolation structure 600 (shown in FIG. 6) and buried layer 110 are used as an etch stop layer for the etching process described above.

Figure 2:
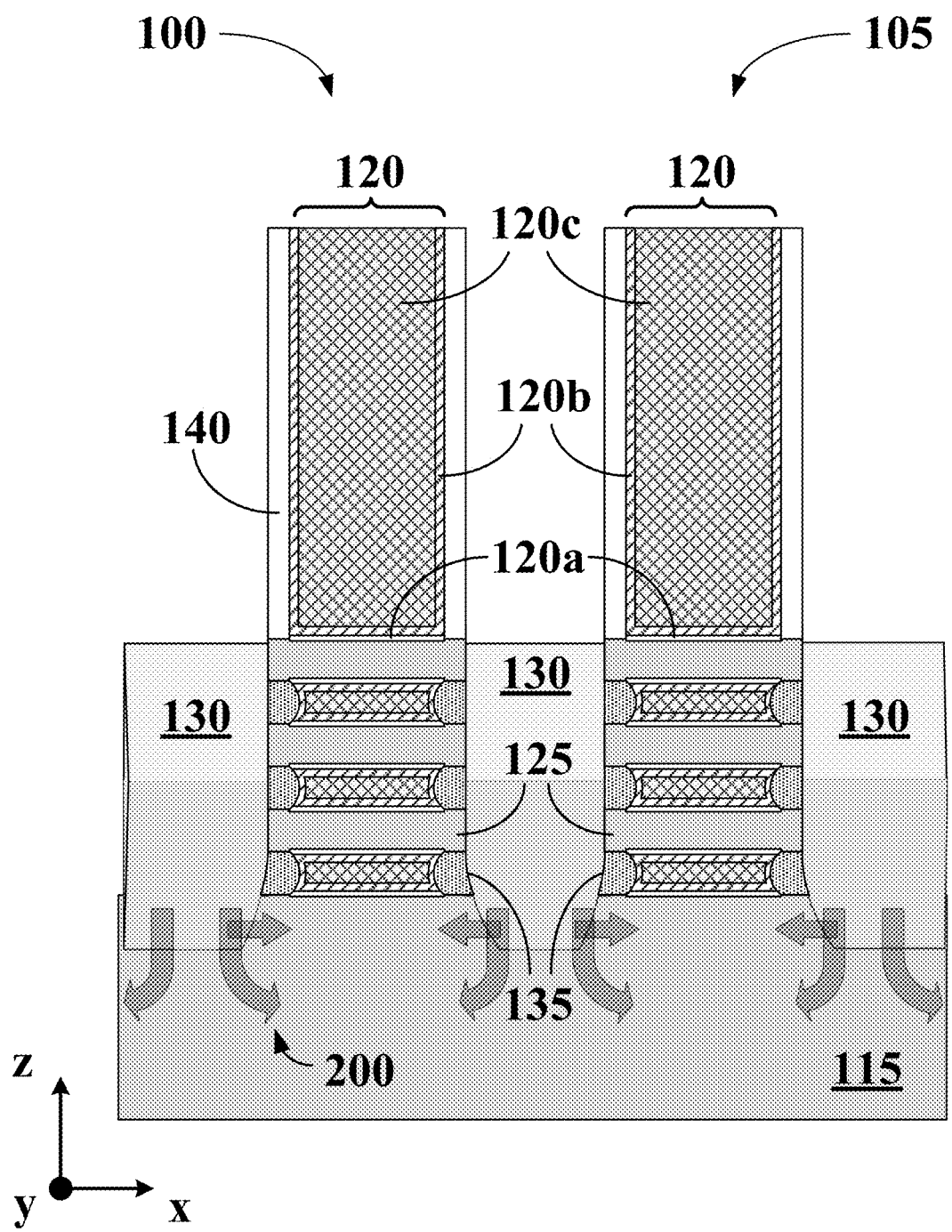
FIG. 2 is a cross-sectional view of gate-all-around nano-sheet FETs formed on a substrate, in accordance with some embodiments.

In some embodiments, if buried layer 110 was absent from substrate 115, the etchants used in operation 325 could recess the silicon made substrate 115 with respect to fin structures 510 to form recessed portions between the un-etched portions of each fin structure 510. Subsequently, S/D epitaxial structures 130 formed on these recessed portions of substrate 115, as shown in FIG. 2, would be susceptible to junction leakage current as indicated by arrows 200. Therefore, buried layer 110 prevents the formation of recessed portions in substrate 115 and the appearance of junction leakage current between S/D epitaxial structures 130 and substrate 115.

Because of operation 325, a "cut" is formed in each fin structure 510. The cut divides each fin structure 510 into two separate portions; each portion covered by a sacrificial gate structure 700 as shown in FIG. 8.

In some embodiments, the removal process results in a tapered profile 800 at the base of fin structure 510 as shown in FIG. 8. This can be attributed, for example, to the ability of the etchants to reach the base of fin structures 510 in sufficient concentrations to remove portions of NS layers 505.

Figure 9:
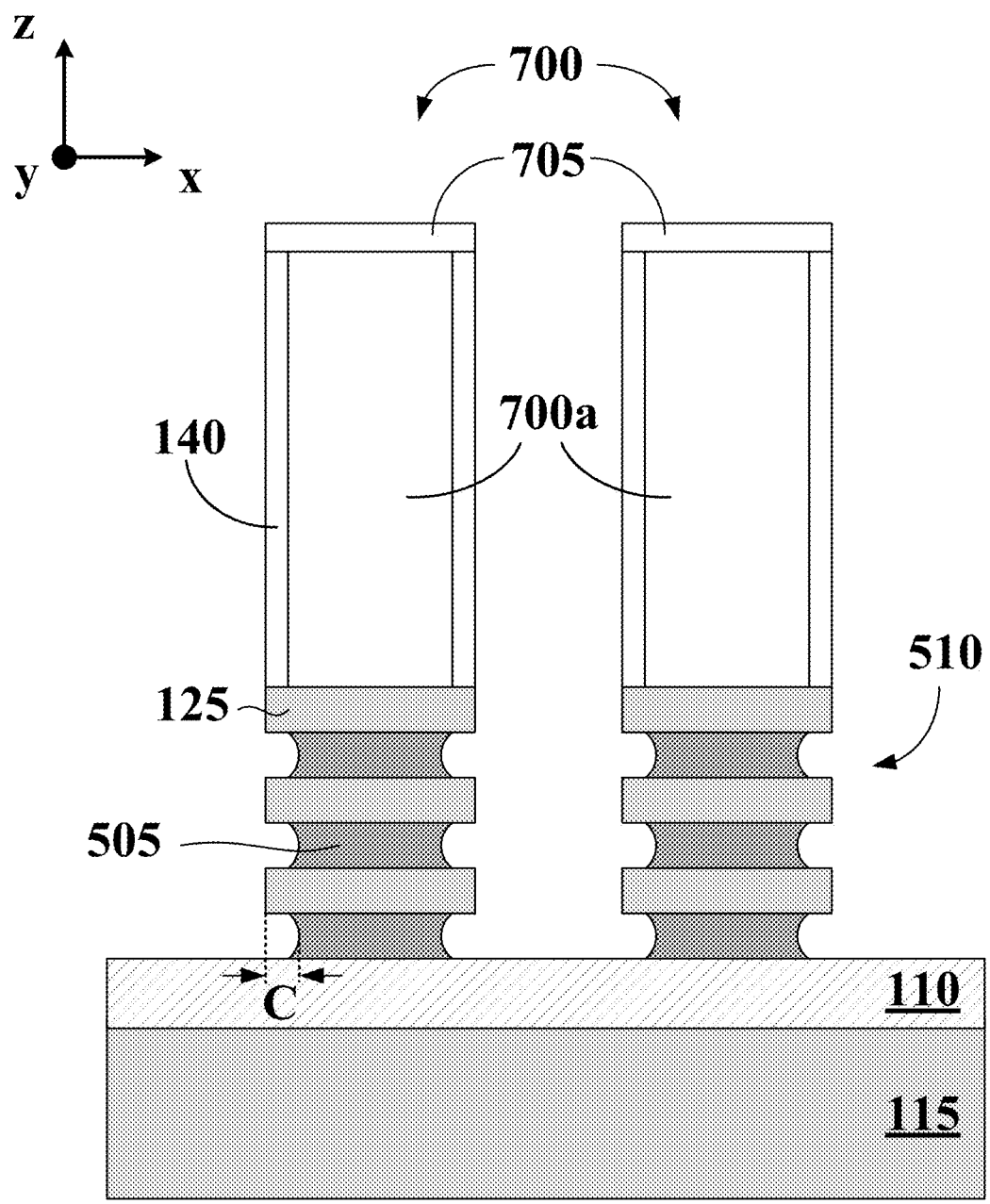

In referring to FIG. 3B, method 300 continues with operation 330 and the process of selectively etching edge portions the first NS layers (NS layers 505) from fin structures 510. According to some embodiments, FIG. 9 shows the structure of FIG. 8 after operation 330 where exposed edges of NS layers 505 are laterally etched (e.g., recessed) along the x-direction. According to some embodiments, exposed edges of NS layers 505 are recessed (e.g., partially etched) by an amount C that ranges from about 2 nm to about 10 nm along the x-direction as shown in FIG. 9. In some embodiments, spacer structures 135 shown in FIG. 1 will be formed on the recessed portions of NS layers 505. According to some embodiments, recessed amounts less than about 2 nm result in spacer structures 135 that are too thin to provide adequate electrical isolation between gate structures 120 and S/D epitaxial structures 130 shown in FIG. 1. On the other hand, recessed amounts greater than about 10 nm result in spacer structures 135 that reduce the gate length of the resulting transistor structures (e.g., GAA FETs 100 and 105).

In some embodiments, the recess in NS layers 505 can be achieved with a dry etching process that is selective towards SiGe. For example, halogen-based chemistries exhibit high etching selectivity towards Ge and low towards Si. Therefore, halogen gases etch Ge-containing layers (e.g., NS layers 505) at a higher etching rate than substantially Ge-free layers (e.g., NS layers 125). In some embodiments, the halogen-based chemistries include fluorine-based and/or chlorine-based gasses. Alternatively, a wet etching chemistry with high selectivity towards SiGe can be used. In some embodiments, a wet etching chemistry may include a mixture of sulfuric acid ($H_2SO_4$) and hydrogen peroxide ($H_2O_2$) (SPM), or a mixture of ammonia hydroxide with $H_2O_2$ and water (APM). The aforementioned etching processes are timed so that the desired amount of SiGe is removed.

In some embodiments, NS layers 505 with a higher Ge atomic concentration have a higher etching rate than NS layers 505 with a lower Ge atomic concentration. Therefore, the etching rate of the aforementioned etching processes can be adjusted by modulating the Ge atomic concentration (e.g., the Ge content) in NS layers 505. As discussed above, the Ge content in NS layers 505 can range between about 20% and about 30%. A SiGe nano-sheet layer with about 20% Ge can be etched slower than a SiGe nano-sheet layer with about 30% Ge. Consequently, the Ge concentration can be adjusted accordingly to achieve the desired etching rate and selectivity between NS layers 505 and NS layers 125.

In some embodiments, a Ge concentration below about 20% does not provide adequate selectivity between NS layers 505 and NS layers 125. For example, the etching rate between NS layers 505 and NS layers 125 becomes substantially similar to one another and both types of nano-sheet layers can be etched during the etching process. On the other hand, for Ge concentrations higher than about 30%, Ge atoms can out-diffuse from NS layers 505 towards NS layers 125 (e.g., during growth) and change the selectivity between NS layers 505 and NS layers 125 during etching. Since Ge out-diffusion cannot be controlled, Ge concentrations higher than about 30% can result in unpredictable etching amounts.

In some embodiments, the etchants used in operation 330 have a low etching selectivity towards buried layer 110. In some embodiments, buried layer 110 is etched less than about 2 nm during operation 330. As discussed above, the thickness of buried layer 110 can be adjusted based on the etching selectivity of the etchants used in operation 330. For example, a thicker buried layer 110 can be used for etchants with higher etching selectivity. Similarly, a thinner buried layer 110 can be used for etchants with lower etching selectivity. In some embodiments, the low etching selectivity of buried layer 110 is achieve either because of the material included in buried layers 110 (e.g., carbon in Si:C buried layers 110) or because of the presence of dopants (e.g., P, B, As, or combinations thereof in Si:P, Si:B, or Si:As) at high concentrations (e.g., greater than about $1\times10^{21}$ atoms/cm$^3$).

As discussed above, if buried layer 110 was not present on substrate 115, the etchants used in operation 325 would recess substrate 115. These recessed portions, now exposed to the etchants of operation 330, could be further etched and position S/D epitaxial structures 130 shown in FIG. 2 deeper into substrate 115. The placement of S/D epitaxial structures 130 deeper into substrate 115 exacerbates junction leakage and further compromises the performance of GAA-FETs 100 and 105 shown in FIG. 2.

Figure 10:
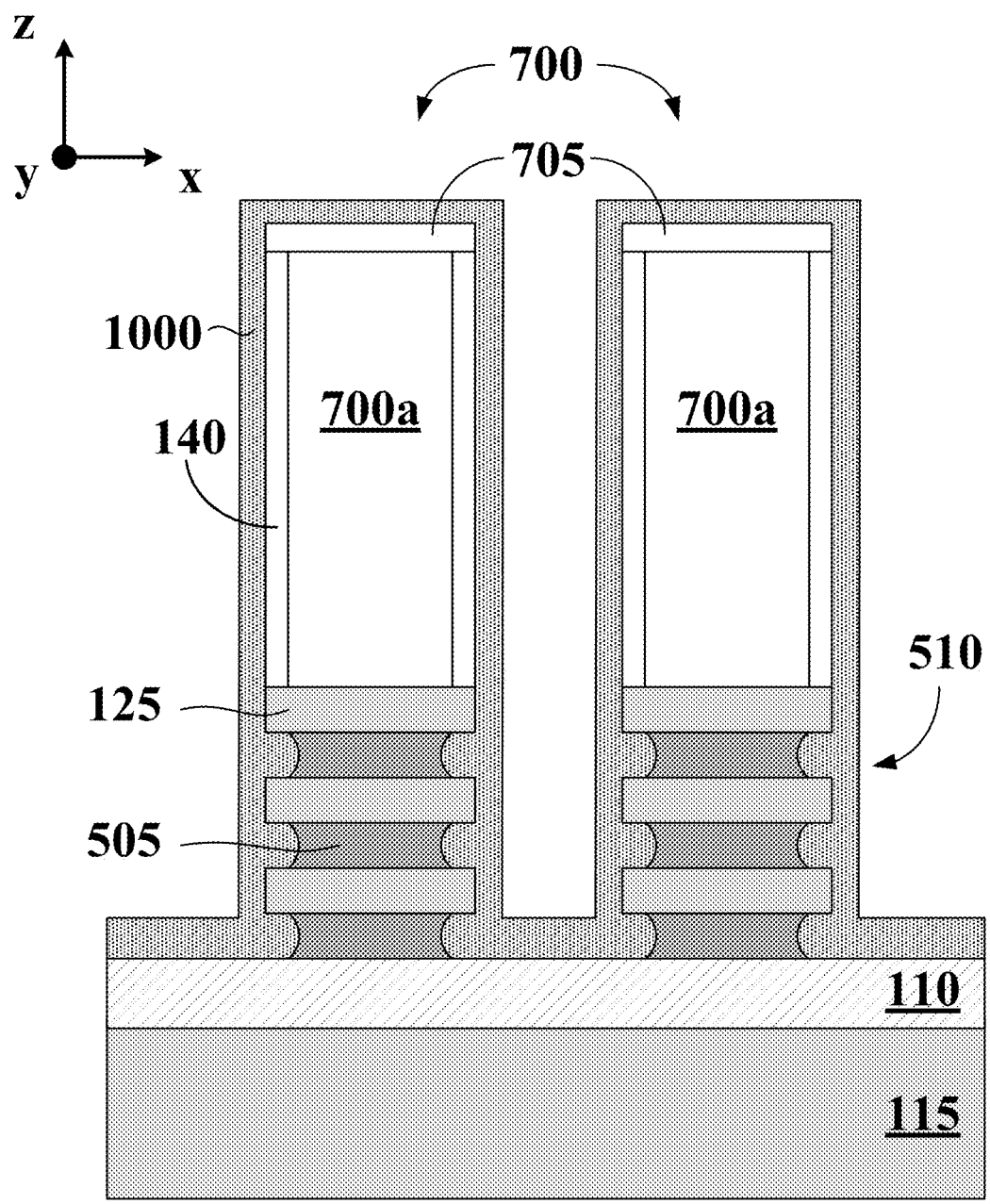

In referring to FIG. 3B, method 300 continues with operation 335 and the process of forming a spacer structure (e.g., spacer structure 135) on the etched portions of each first NS layer (e.g., each NS layer 505). By way of example and not limitation, the formation of spacer structures 135 can be described as follows. A spacer layer 1000 is blanket deposited over the entire structure of FIG. 9 as shown in FIG. 10. For example, spacer layer 1000 is deposited on the exposed surfaces of buried layer 110, fin structure 510, gate spacers 140, and capping layer 705. In some embodiments, spacer layer 1000 is deposited at a thickness between about 5 nm and about 10 nm to fill the recess in each NS layer 505 shown in FIG. 9. In some embodiments, spacer layer 1000 includes a silicon-based dielectric, such as silicon nitride (SiN), silicon oxy-carbon-nitride (SiOCN), silicon carbon-nitride) SiCN, or silicon oxy-nitride (SiON). In some embodiments, spacer layer 1000 can be deposited with a plasma-enhance atomic layer deposition (PEALD) process or another suitable method capable of depositing conformal layers. As shown in FIG. 10, spacer layer 1000 fills the space formed by the recessed edge portions of NS layers 505. Because of the spacer layer deposition, sidewall surfaces of fin structure 510 are no longer exposed.

Figure 11:
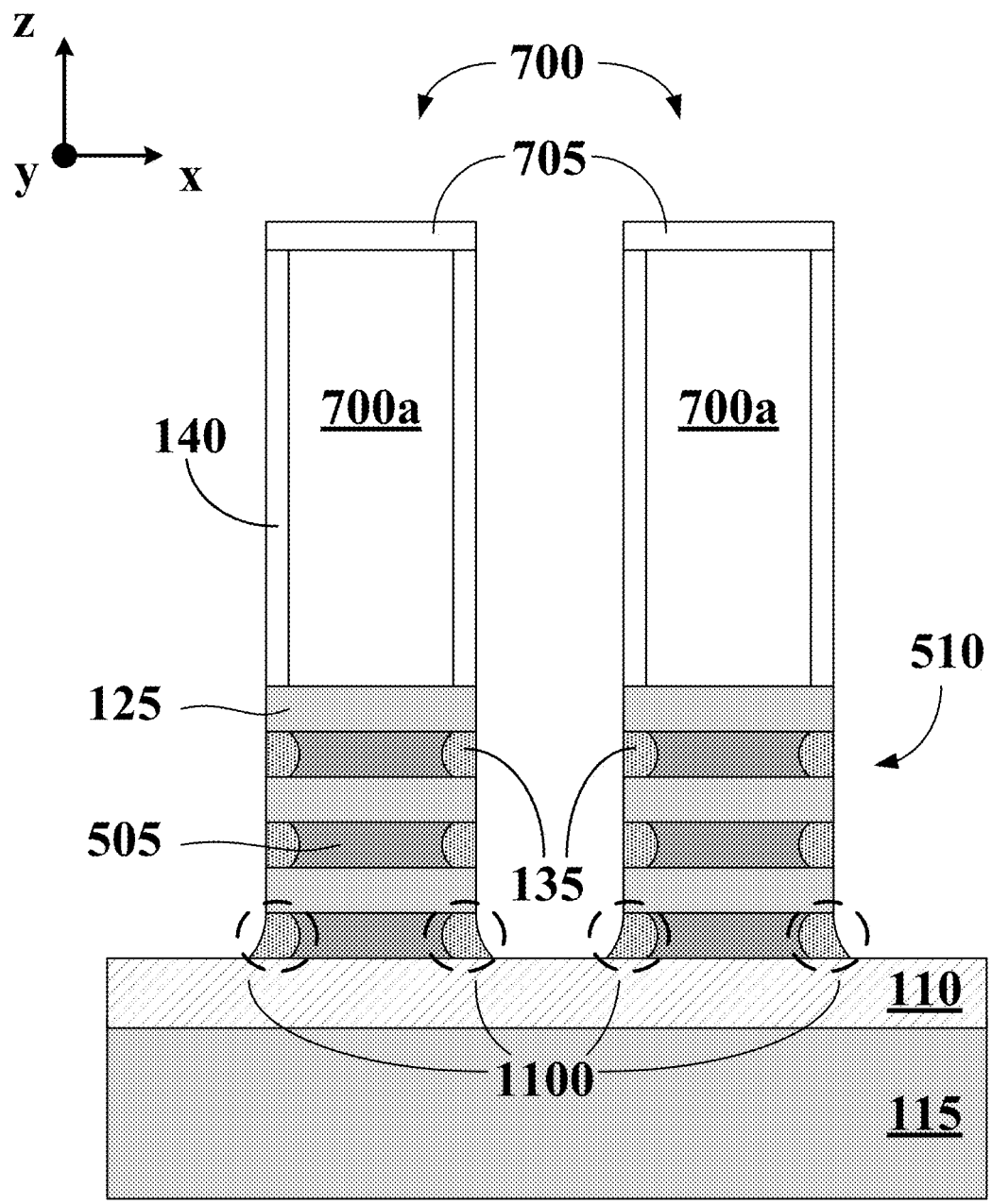

In a subsequent operation, spacer layer 1000 is removed with an anisotropic etching process to form spacer structures 135 shown in FIGS. 1 and 11. By way of example and not limitation, spacer layer 1000 can be removed with any dry etching chemistry capable of removing silicon nitride based materials, such as a mixture of fluorocarbon-based chemistry (e.g., fluorinated hydrocarbons) with oxygen and/or nitrogen. In some embodiments, the anisotropic etching process is terminated when spacer layer 1000 is sufficiently removed from buried layer 110 and sidewall surfaces of fin structure 510. During the aforementioned etching process, gate spacers 140 and capping layer 705 may be partially etched.

In some embodiments, the removal process results in a tapered profile 1100 at the base of fin structure 510 as shown in FIG. 11. This can be attributed, for example, to the ability of the etchants to reach the base of fin structures 510 in sufficient concentrations to remove portions of spacer layer 1000. For this reason, spacer structures 135 towards the base of fin structure 510 can be thicker than spacer structures 135 towards the top of fin structure 510.

Figure 12:
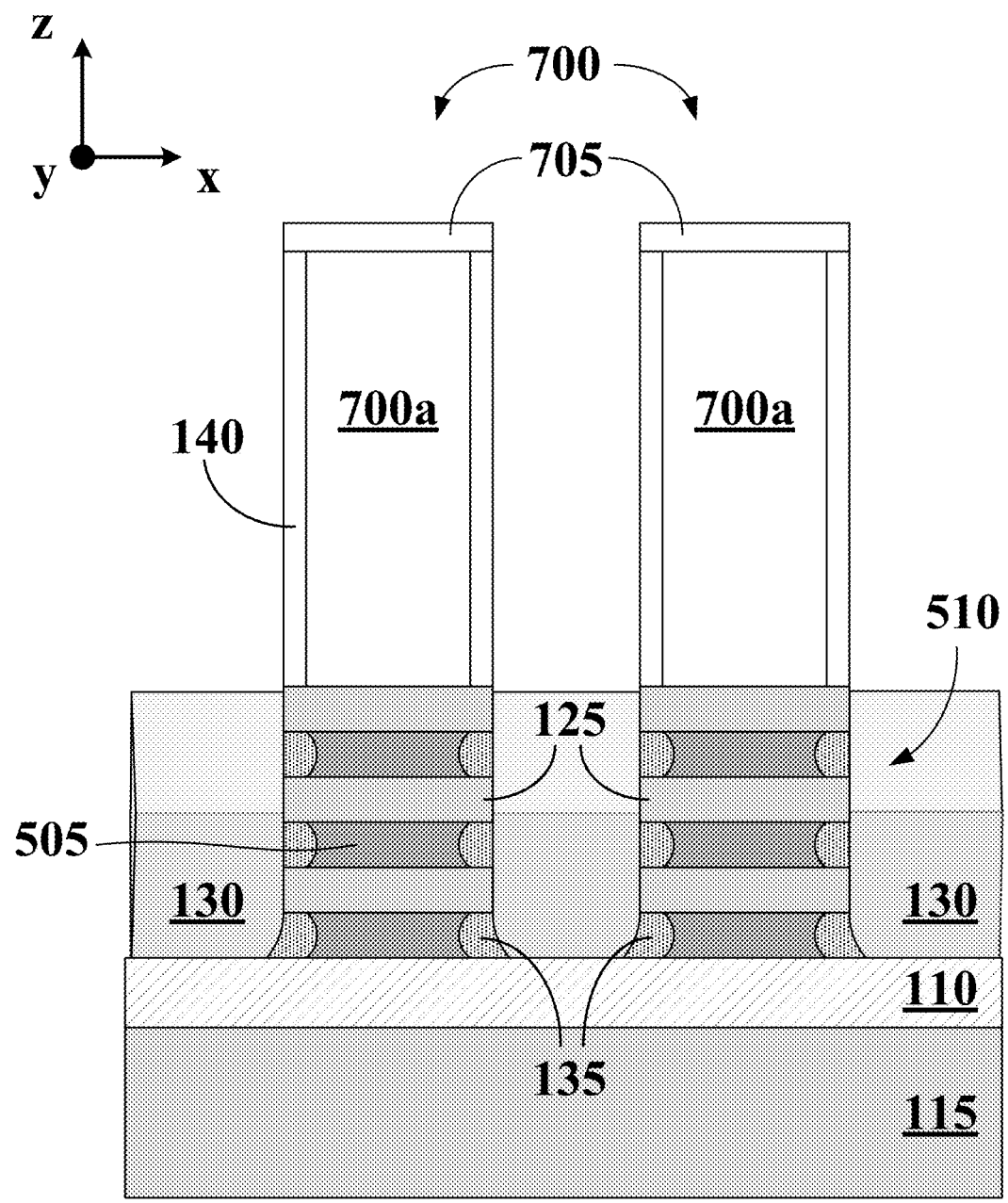

In referring to FIGS. 3B and 12, method 300 continues with operation 340 and the process of forming S/D epitaxial structures 130 on buried layer 110. In some embodiments, S/D epitaxial structures 130 are grown using a CVD process similar to the one used to form NS layers 505 and the NS layers 125. For example, P-doped Si S/D epitaxial structures 130 (e.g., appropriate for n-type GAA FETs 100 and 105) can be grown using a silane ($SiH_4$) precursor. The phosphorous dopant can be introduced during growth. In some embodiments, the phosphorous concentration can range from about $1 \times 10^{21}$ atoms/$cm^3$ to about $8 \times 10^{21}$ atoms/$cm^3$. The aforementioned doping concentration ranges are not limiting and other doping concentrations are within the spirit and the scope of this disclosure.

Accordingly, a B-doped SiGe S/D epitaxial structures 130 (e.g., appropriate for p-type GAA FETs 100 and 105) can include two or more epitaxial layers (not shown in FIG. 12) grown in succession and having different Ge atomic percentages and B concentrations. For example, a first layer can have a Ge at. % that ranges from 0 to about 40%, and a B dopant concentration that ranges from about $5 \times 10^{19}$ atoms/$cm^3$ to about $1 \times 10^{21}$ atoms/$cm^3$. A second epitaxial layer can have a Ge at. % that ranges from about 20% to about 80%, and a B dopant concentration that ranges from about $3 \times 10^{20}$ atoms/$cm^3$ to about $5 \times 10^{21}$ atoms/$cm^3$. Further, a third epitaxial layer can be a capping layer that has similar Ge at. % and B dopant concentrations with the first layer (e.g., 0 to about 40% for Ge, and about $5 \times 10^{19}$ atoms/$cm^3$ to about $1 \times 10^{21}$ atoms/$cm^3$ for B dopant). The aforementioned doping concentrations are not limiting and other doping concentrations are within the spirit and the scope of this disclosure.

In some embodiments, due to the base tapered profile of 1100 of fin structure 510 shown in FIG. 11, the sidewall profile of S/D epitaxial structures 130 abutting fin structures 510 is not vertical. Instead, the sidewall profile of S/D epitaxial structures 130 abutting fin structures 510 follows the contour of fin structure 510 as shown in FIG. 12. In some embodiments, the top width of S/D epitaxial structures 130 along the x-direction is larger than their bottom width along the same direction as shown, for example, in FIG. 12.

In some embodiments, after the formation of S/D epitaxial structures 130 on buried layer 110, capping layer 705 and sacrificial gate structure 700 are removed to expose top and sidewall surfaces of fin structures 510. An etching process selective to NS layers 505 (e.g., similar to the one used in operation 330 to etch the edge portions of NS layer 505) removes NS layers 505 from fin structures 510 without removing NS layers 125 and spacer structures 135. Subsequently the layers of gate structures 120 are formed on the exposed surfaces of NS layers 125 to form GAA-FETs 100 and 105 shown in FIG. 1.

In some embodiments, method 300 can be used to form buried layers 110 for n-type and p-type GAA-FETs on the same substrate. However, buried layer 110 should be doped with a suitable dopant type to achieve an appropriate p-n junction depletion region under each GAA-FET type. For example, for p-type GAA-FETs (e.g., with p-type doped S/D epitaxial structures), buried layer 110 should include As and/or P dopants (e.g., n-type dopants). Accordingly, for n-type GAA-FETs (e.g., with n-type doped S/D epitaxial structures), buried layer 110 should include boron dopants (e.g., p-type). In other words, buried layer 110 should include an opposite dopant type from that in S/D epitaxial structures 130. In some embodiments, buried layers 110 formed as a wide bandgap material (e.g., Si:C) are suitable for both n-type and p-type GAA-FETs.

Figure 13A:
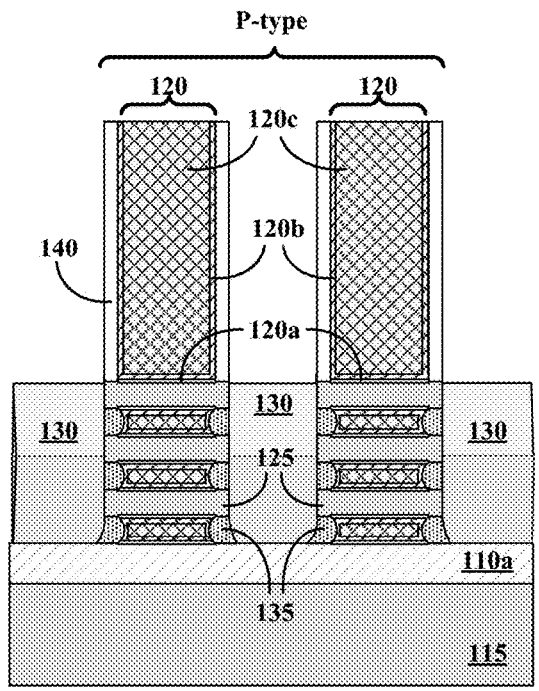
FIGS. 13A-13D are cross-sectional views of n-type and p-type gate-all-around nano-sheet FETs with different types of buried layers on a substrate, in accordance with some embodiments.
Figure 13B:
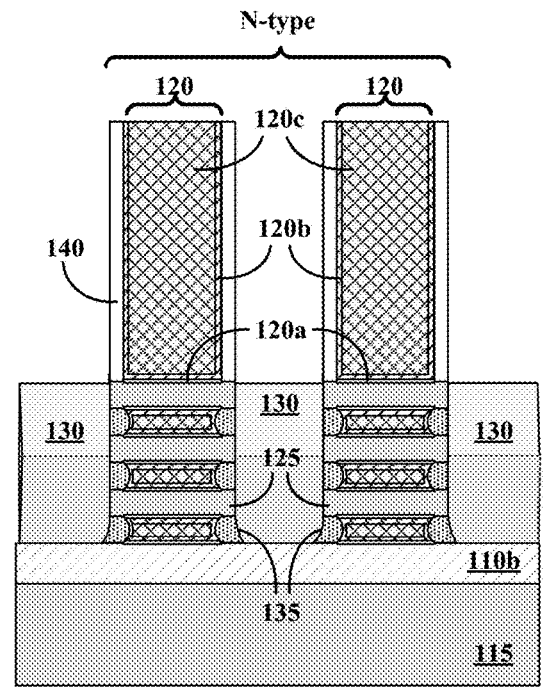
Figure 13C:
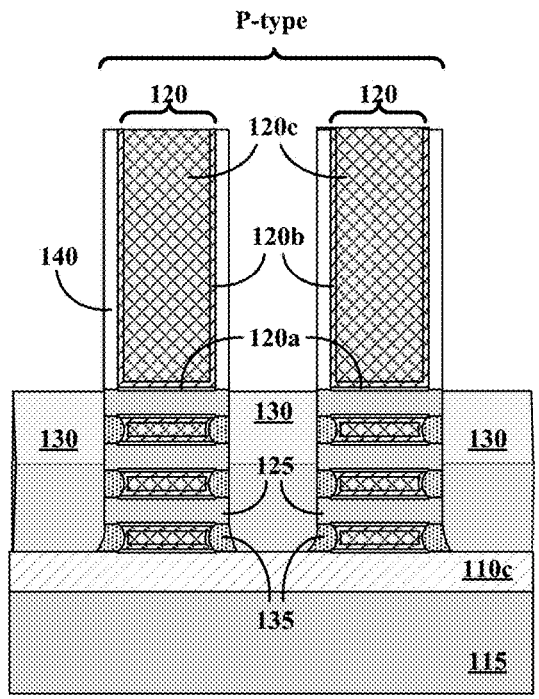
Figure 13D:
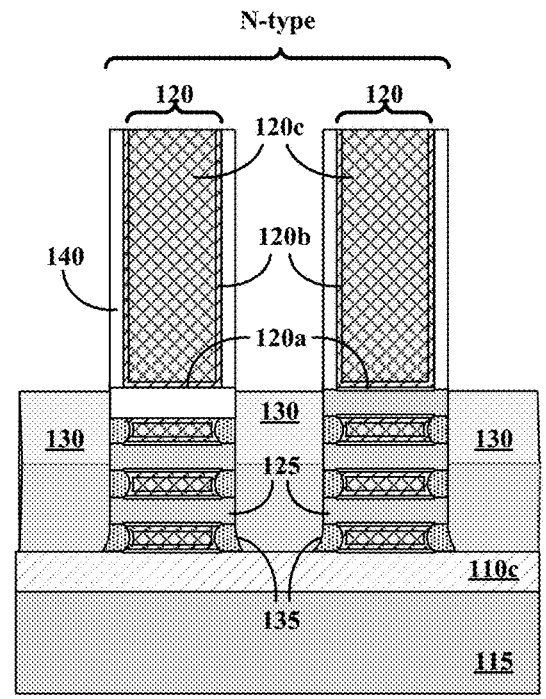

According to some embodiments, FIGS. 13A, 13B, 13C, and 13D show combinations of n-type and p-type GAA-FETs with different types of buried layers formed on substrate 115 with method 300. For example, FIG. 13A shows p-type GAA-FETs formed on an n-type doped buried layer 110a (e.g., doped with As and/or P), FIG. 13B shows n-type GAA-FETs formed on a p-type doped buried layer 110b (e.g., doped with B), and FIGS. 13C and 13D show p-type and n-type GAA-FETs formed on a wide bandgap buried layer 110c (e.g., a Si:C buried layer). In some embodiments, any combination of p-type and n-type GAA-FETs with respective buried layers shown in FIGS. 13A, 13B, 13C, and 13D can be concurrently formed on substrate 115 using the operations of method 300. By way of example and not limitation, this can be achieved by masking different areas of substrate 115 while other areas of substrate 115 are processed to form buried layers 110a, b, and c with an appropriate type of transistor formed thereon. In some embodiments, the GAA-FETs and buried layers shown in FIGS. 13A, 13B, 13C, and 13D can be formed on the same area of substrate 115 or on different areas of substrate 115.

In some embodiments, the buried layers shown in FIGS. 13A, 13B, 13C, and 13D can be used with other transistor geometries, such as finFETs and GAA nano-wire FETs. Therefore, the buried layers shown in FIGS. 13A, 13B, 13C, and 13D are not limited to GAA-FETs with nano-sheet layers.

The embodiments described herein are directed to methods for the fabrication of buried layers in GAA FETs, which prevent substrate etching and suppress junction leakage. In some embodiments, the buried layer is formed between the GAA FETs and the substrate at a thickness between about 5 nm and about 20 nm. According to some embodiments, the buried layers can be formed for p-type and n-type GAA-FETs and can include doped or un-doped (e.g., intrinsic) silicon layers. If un-doped, the buried layers include a wide bandgap material such as silicon with less than about 5 at. % carbon. If doped, the dopant type in the buried layer is opposite to that in the S/D structures of the GAA-FETs. In some embodiments, the dopants are introduced during growth to achieve a uniform distribution within the buried layer and a high dopant concentration—e.g., higher than about $1 \times 10^{21}$ atoms/$cm^3$.

In some embodiments, a structure includes a substrate and an epitaxial layer grown on the substrate, where the epitaxial layer includes a bandgap higher than that of intrinsic silicon. The structure further includes a transistor structure on the epitaxial layer.

In some embodiments, a structure includes a substrate and a first epitaxial layer grown on the substrate, where the first epitaxial layer includes first dopants. The structure further includes a first transistor structure on the first epitaxial layer, where the first transistor structure includes source/drain (S/D) epitaxial structures with second dopants of an opposite type to that of the first dopants. Additionally, the structure includes a second epitaxial layer grown on the substrate, where the second epitaxial layer includes a bandgap higher than that of intrinsic silicon, and a second transistor structure on the second epitaxial layer, where the second transistor structure comprises S/D epitaxial structures with third dopants.

In some embodiments, a method includes forming a doped epitaxial layer on a substrate, forming a stack of alternating first and second nano-sheet layers on the epitaxial layer, and patterning the stack and the epitaxial layer to form a fin structure. The method further includes forming a sacrificial gate structure on the fin structure, removing portions of the fin structure not covered by the sacrificial gate structure, and etching portions of the first nano-sheet layers. Additionally, the method includes forming spacer structures on the etched portions of the first nano-sheet layers, forming source/drain (S/D) epitaxial structures on the epitaxial layer abutting the second nano-sheet layers, where the S/D epitaxial structures comprise dopants of an opposite type to that of the epitaxial layer. The method also includes removing the sacrificial gate structure, removing the first nano-sheet layers, and forming a gate structure around the second nano-sheet layers.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A structure, comprising;
   a substrate;
   an epitaxial layer grown on the substrate, wherein the epitaxial layer comprises a bandgap higher than that of intrinsic silicon; and
   a transistor structure comprising a gate-all-around channel region directly above the epitaxial layer.

2. The structure of claim 1, wherein the epitaxial layer comprises a carbon atomic concentration greater than 0% and less than 5%.

3. The structure of claim 1, wherein the epitaxial layer has a thickness between about 2 nm and about 20 nm.

4. The structure of claim 1, wherein the transistor structure is an n-type or a p-type device.

5. The structure of claim 1, further comprising another transistor structure on the epitaxial layer adjacent to the transistor structure, wherein the other transistor structure and the transistor structure have a common S/D epitaxial structure.

6. The structure of claim 1, wherein the substrate and the epitaxial layer comprise silicon.

7. The structure of claim 1, wherein a channel region and source/drain structures of the transistor structure contact the epitaxial layer.

8. The structure of claim 1, wherein the transistor structure further comprises a gate structure in contact with the epitaxial layer.

9. A structure, comprising;
   a substrate;
   a first epitaxial layer grown on the substrate, wherein the first epitaxial layer comprises first dopants;
   a first transistor structure on the first epitaxial layer, wherein the first transistor structure comprises source/drain (S/D) epitaxial structures with second dopants of an opposite type to that of the first dopants;
   a second epitaxial layer grown on the substrate, wherein the second epitaxial layer comprises a bandgap higher than that of intrinsic silicon; and
   a second transistor structure on the second epitaxial layer, wherein the second transistor structure comprises S/D epitaxial structures with third dopants.

10. The structure of claim 9, wherein the first dopants are n-type and the second and third dopants are p-type.

11. The structure of claim 9, wherein the first dopants are p-type and the second and third dopants are n-type.

12. The structure of claim 9, wherein the first dopants comprise a dopant concentration greater than about $1 \times 10^{21}$ atoms/cm$^3$.

13. The structure of claim 9, wherein the first dopants have a substantially uniform dopant distribution within the first epitaxial layer.

14. The structure of claim 9, wherein the first and second epitaxial layers comprise a silicon layer with a thickness between about 5 nm and about 20 nm.

15. The structure of claim 9, wherein the second epitaxial layer comprises carbon with a concentration less than about 5 atomic percent.

16. A method, comprising:
   forming an epitaxial layer on a substrate, wherein the epitaxial layer comprises dopants;
   forming a stack of alternating first and second nano-sheet layers on the epitaxial layer;
   patterning the stack and the epitaxial layer to form a fin structure;
   forming a sacrificial gate structure on the fin structure;
   removing portions of the fin structure not covered by the sacrificial gate structure;
   etching portions of the first nano-sheet layers;
   forming spacer structures on the etched portions of the first nano-sheet layers;
   forming source/drain (S/D) epitaxial structures on the epitaxial layer abutting the second nano-sheet layers, wherein the S/D epitaxial structures comprise dopants of an opposite type to that of the epitaxial layer;
   removing the sacrificial gate structure;
   removing the first nano-sheet layers; and
   forming a gate structure around the second nano-sheet layers.

17. The method of claim 16, wherein forming the epitaxial layer on the substrate comprises growing the epitaxial layer with a dopant concentration greater than about $1 \times 10^{21}$ atoms/cm$^3$.

18. The method of claim 16, wherein forming the epitaxial layer on the substrate comprises growing the epitaxial layer with a substantially uniform dopant distribution.

19. The method of claim 16, wherein forming the epitaxial layer on the substrate comprises growing the epitaxial layer with a carbon concentration less than about 5 atomic percent.

20. The method of claim 16, wherein forming the epitaxial layer on the substrate comprises growing the epitaxial layer with a thickness between about 5 nm and about 20 nm.

\* \* \* \* \*